United States Patent [19]

Beauchamp et al.

[11] Patent Number: 5,449,413
[45] Date of Patent: Sep. 12, 1995

[54] UV/IR REFLECTING SOLAR CELL COVER

[75] Inventors: William T. Beauchamp; Trudy Tuttle-Hart, both of Santa Rosa, Calif.

[73] Assignee: Optical Coating Laboratory, Inc., Santa Rosa, Calif.

[21] Appl. No.: 243,429

[22] Filed: May 16, 1994

Related U.S. Application Data

[63] Continuation of Ser. No. 61,379, May 12, 1993, abandoned.

[51] Int. Cl.6 .................. H01L 31/0232; H01L 31/04
[52] U.S. Cl. ................................ 136/257; 136/256; 250/226; 257/431; 359/359; 359/584; 359/586; 359/588; 359/589
[58] Field of Search .................... 136/256–257; 250/226; 257/431; 359/359, 584, 586, 588–589

[56] References Cited

U.S. PATENT DOCUMENTS

| 3,076,861 | 2/1963 | Samulon et al. | 136/257 |
| 3,247,392 | 4/1966 | Thelen | 250/226 |
| 4,229,066 | 10/1980 | Rancourt et al. | 359/359 |
| 4,293,732 | 10/1981 | Rancourt et al. | 136/257 |
| 5,103,337 | 4/1992 | Schrenk et al. | 359/359 |
| 5,138,219 | 8/1992 | Krisl et al. | 313/112 |
| 5,233,465 | 8/1993 | Wheatley et al. | 359/359 |

FOREIGN PATENT DOCUMENTS

| 4-133004 | 5/1992 | Japan | 359/359 |
| 4-177204 | 6/1992 | Japan | 359/359 |

Primary Examiner—Aaron Weisstuch
Attorney, Agent, or Firm—Philip A. Dalton

[57] ABSTRACT

A new solar cell cover comprises a substrate that transmits the spectral region to which the solar cell responds and a multilayer infrared-reflecting coating which incorporates means for suppressing low order reflections. The multilayer coating may also contain ultraviolet or blue coatings and be formed on one or both substrate surfaces. The multilayer coating reflects spectral bands which are adjacent to the short- and long-wavelength limits of the spectral response of the cell. The upper limit wavelength of the short-wavelength reflection band and the lower wavelength limit of the long-wavelength reflection band are independent and may be separately specified.

25 Claims, 11 Drawing Sheets

UV/IR REFLECTING SOLAR CELL COVER

This is a continuation of application Ser. No. 08/061,379, filed May 12, 1993, now abandoned.

BACKGROUND OF THE INVENTION a. Field of the Invention

The present invention relates to solar cells and, in particular, to covers for solar cells, and to methods of manufacturing such devices.

b. Current State of the Relevant Technology

SPACE APPLICATIONS FOR SOLAR CELLS

Photovoltaic solar cells, which convert a portion of the incident solar radiation into electrical energy, are an important, even critical, source of electrical power in space craft. However, the efficiency of the conversion process is reduced at elevated temperatures and is permanently degraded by ionizing radiation. To maintain high conversion efficiency, solar cells on space craft are cooled by radiation from transparent glass or glass-like covers, which also may shield the cells from ionizing radiation.

Weight is a primary concern in space craft. For example, one rule of thumb is that the cost of launching a payload such as a satellite or other space craft into orbit is up to about one million dollars per pound. Quite obviously, then, maintaining high conversion efficiency, and thus reducing the payload weight of the solar cells to a minimum, is very important. Techniques which increase the efficiency by as much as one to three percent are very desirable.

Figure 1:
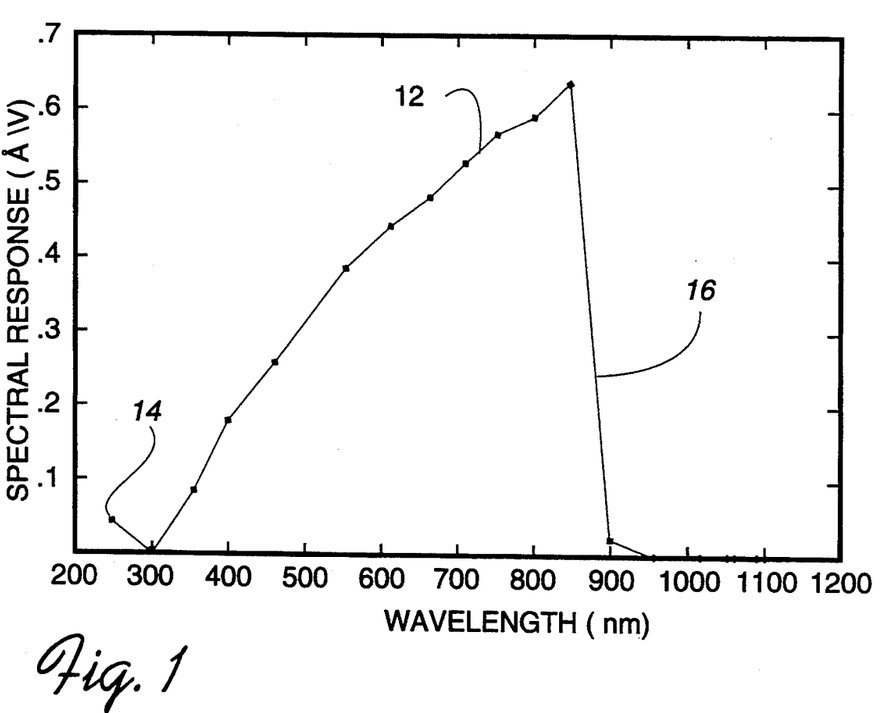
FIG. 1 depicts the spectral response of a gallium arsenide photovoltaic solar cell.

Many solar cells are formed of silicon, which has a spectral response between 350 nanometers (nm) and 1100 nm. That is, only incident radiation with wavelengths between 350 and 1100 nm is converted to electrical current in the silicon cell. Another solar cell material, gallium arsenide (GaAs), has a spectral response between about 350 and 900 nm. An exemplary spectral response curve for GaAs is shown in FIG. 1 and is identified there by reference numeral 10.

CURRENT STATE OF PROTECTIVE COATING TECHNOLOGY

Radiation that is not reflected by a solar cell or its cover is absorbed and converted into both electrical power and heat. The heat raises the cell temperature and lowers the efficiency for conversion of absorbed radiation into electrical power. Thus, absorbed radiation of wavelengths for which there is a high spectral response (see range 12, FIG. 1) will cause a net increase in the electrical output of the cell, but absorbed radiation of wavelengths for which there is a low spectral response (ranges 14 and 16, FIG. 1) will cause a net decrease in electrical output.

Protective solar cell covers are attached to solar cells with transparent adhesive or cement. Typically, the adhesives are degraded by ultraviolet (UV) radiation of wavelengths in the 300-350 nm region, especially the region between 300 and 320 nm.

CURRENT STATE OF PROTECTIVE COATING TECHNOLOGY

To protect the cover cements from UV degradation, most solar cell covers are or include material which is opaque to radiation in this region. The opacity of solar cell covers may be provided by absorption in the glass or glass-like substrate or by the addition of a coating to the surface of the cover. For example, cerium-doped glasses, such as Pilkington's CMX glass or Corning's 0213 glass, absorb wavelengths shorter than about 350 nm and may be used for such covers. In this regard, commonly assigned U.S. Pat. No. 4,293,732 issued to Rancourt and Seddon describes an ultraviolet reflecting (UVR) solar cell cover coating which is opaque for wavelengths shorter than about 350 nm. The '732 patent is incorporated herein by reference.

To further improve the electrical output of solar cells, optical coatings may be used to reflect spectral portions of the incident solar radiation which the cell does not convert to electricity. Without optical coatings, solar radiation outside the spectral response region (radiation with wavelengths longer or shorter than that of the spectral response region) may be absorbed by the cover or the cell causing the temperature of the cell to rise and the conversion efficiency to decrease.

Multilayer optical coatings are commonly used on covers for silicon solar cells to reflect the ultraviolet wavelengths between 300 and 350 nm. The above-referenced Rancourt and Seddon '732 patent describes a multilayer, UVR solar cell cover coating which reflects most solar radiation with wavelengths shorter than about 350 nm.

One form of the Rancourt and Seddon UVR coating which contains only ultraviolet transparent layers may be placed on the first surface of cerium-doped cover glass. The first surface of a solar cell cover is the surface onto which the solar radiation is first incident, that is, the side facing the sunlight. The second surface of the cover is adjacent to the cement which bonds the cover to the cell. The cerium-doped substrate glass completely absorbs any portion of the solar radiation shorter than about 350 nm which is not reflected by the UVR coating and thus assures that the bonding cement is completely protected from damaging ultraviolet radiation. Another form of the UVR coating contains one or two titanium oxide layers in addition to ultraviolet transparent layers and may be placed on the first or the second surface of ultraviolet transparent cover glasses such as fused silica or quartz. The titanium oxide layers in the UVR stack insure complete absorption of solar radiation with wavelengths shorter than about 350 nm and thus protect the bonding cement.

Commonly assigned U.S. Pat. No. 3,247,392 issued to Thelen and the publication "Multilayer Filters with Wide Transmittance Bands," in *J. Opt. Soc Am.* 53, 1266 (1963) by Alfred Thelen describe optical coatings which simultaneously reflect bands of infrared (IR) and ultraviolet wavelengths. Thelen's design is a periodic multilayer composed of three materials including titanium oxide with a prescribed relationship between the refractive indices. The presence of titanium oxide assured total absorption of solar radiation with wavelengths shorter than about 350 nm. Ultraviolet transparent materials with the index relationship prescribed by Thelen are not known.

Applied to solar cell covers, the Thelen coatings reflect an ultraviolet band with wavelengths shorter than about 400 nm and an infrared band with wavelengths longer than about 1100 nm. The short-and long-wavelengths limits of the transmission band, i.e. 400 and 1100 nm, are fixed by the indices of the thin film materials used in Thelen's design. At the time of the patent and publication (circa 1963), silicon solar cells responded only to radiation between these two bands.

Subsequent developments in silicon cells have moved the short-wavelength edge of the response region to about 350 nm. In the absence of appropriate thin film materials, Thelen's design cannot be adjusted to accommodate the wider spectral response of present-day silicon solar cells. The same is true for GaAs, as discussed below.

Silicon is transparent for wavelengths longer than the response region, i.e., longer than about 1100 nm. The metal electrode on the back surface of the silicon solar cell reflects a portion of the transmitted infrared radiation. However, there is a need to reflect a greater portion of the infrared radiation, especially the most solar-intense radiation with wavelengths immediately adjacent to the long wavelength limit of the response region.

Gallium arsenide (GaAs) solar cells are made from thin film GaAs crystals grown epitaxially on the surface of a single crystal host material, typically germanium (Ge). GaAs, like silicon, is transparent for wavelengths longer than the response region (the response region is shown in FIG. 1). However, germanium absorbs radiation with wavelengths shorter than about 1800 nm. Therefore, a GaAs cell composed of GaAs grown on germanium will absorb a portion of the radiation between about 900 and 1800 nm. There is a need to reflect this infrared radiation in order to maintain the cell temperature and, thereby, the cell conversion efficiency.

In order to use Thelen's design for present-day silicon cells with the response region extending down to 350 nm or in GaAs cells with the response region extending down to 300 nm or 350 nm, one needs ultraviolet transmitting thin film materials with the prescribed relationship between refractive indices. Titanium oxide and mixtures containing titanium oxide absorb radiation with wavelengths shorter than about 350 nm and would not be suitable for reflecting this wavelength band. Since ultraviolet-transparent materials with the requisite properties are not known, a different thin film design is required.

SUMMARY OF THE INVENTION

In one aspect, our invention is embodied in an infrared (IR) reflector which incorporates order suppressing matching layers such that no short/low orders are present that would degrade optical transmission through the reflector and any associated cover. As a result, and as embodied in a blue red (ultraviolet-infrared) reflector, the infrared reflector is optically completely independent of the ultraviolet reflector.

In another aspect, our invention is embodied in a solar-cell cover which reflects infrared and blue or ultraviolet radiation, or infrared radiation. Combined with solar cells, the new cover provides increased electrical output, presently of several percent compared to previous cover and cell combinations, by reducing the cell operating temperature. The new cover reflects portions of solar radiation with wavelengths that are shorter than and longer than the wavelengths which are effectively converted to electrical energy by state-of-the-art solar cells.

In another, related aspect, our invention is embodied in an L (low index of refraction) and H (high index of refraction) stack design for a blue red reflector which is implemented using one or two coatings (that is, combined or separate UV and IR reflector coatings).

In one preferred embodiment, the order suppression is provided in the L and H layer stack design by the use of principal (thick) layers separated by thin layers which provide admittance or impedance matching to the thick layers in the wavelength region of high transmission and therefore eliminates reflection between the layers.

Specific embodiments of our design include blue red reflector covers for solar cells in which the multilayer UV and IR coatings are formed on opposite sides of an associated substrate; alternatively, covers in which the UV and IR coatings are combined into an integral multilayer coating formed on one side of the associated substrate; and IR-only reflector covers (no UV coating).

In one specific aspect, a blue red reflector cover in accordance with our invention comprises a substrate of material transparent over the spectral response range of the associated solar cell and having a first major surface on the solar incident side of the solar cell and a second major surface on the side thereof optically opposite the solar incident side; and a multilayer thin film composite comprising alternating layers of low and high index of refraction materials. The composite includes an ultraviolet reflector comprising a first group of layers selected for reflecting ultraviolet radiation adjacent and below the shorter wavelength end of the response range, and an optically independent infrared reflector comprising a second group of layers selected for reflecting infrared radiation adjacent and above the longer wavelength end of the spectral response range.

Various configurations may be used and in given applications may be preferred. These include configurations in which the ultraviolet reflector is formed on the solar incident side with respect to the infrared reflector; the ultraviolet reflector is formed on the solar incident side of the substrate; both the ultraviolet reflector and the infrared reflector are formed on the solar incident side of the substrate; and both the ultraviolet reflector and the infrared reflector are formed on the second major surface of the substrate.

In another specific aspect, our invention is embodied in an infrared reflector cover for a solar cell or panel which comprises a substrate of material transparent over the spectral response range of the solar cell; and a multilayer thin film composite formed on the substrate of alternating layers of low and high index of refraction materials and comprising a first group of layers selected for reflecting incident infrared radiation adjacent and above the longer wavelength end of the response range of the solar cell, and an anti-reflection component comprising a second group of layers selected for decreasing the reflection of incident radiation across the spectral response range.

In other aspects, suitable low index materials include silicon oxide and suitable high index materials include tantalum oxide. Also, suitable substrate materials include cerium-doped glass and fused silica.

In one preferred embodiment, the ultraviolet and infrared reflectors are designed for a gallium arsenide solar panel having a spectral response range of approximately 350–900 nm. In another preferred embodiment, the ultraviolet and infrared reflectors are designed for a silicon solar panel having a spectral response range of approximately 350–1100 nm.

Our invention also extends to the combination of a solar panel comprising a solar radiation responsive member, and a cover as described above. Suitable solar radiation responsive members include gallium arsenide, silicon, and materials which are responsive and are stable in the applicable environment.

BRIEF DESCRIPTION OF THE DRAWINGS

The above and other aspects of the invention are described below in conjunction with the following drawings.

DETAILED DESCRIPTION OF PREFERRED EMBODIMENTS

OVERVIEW

Our new cover is a multilayer coated onto a suitable substrate such as fused silica or cerium-doped glass that reflects infrared bands or ultraviolet and infrared bands (also called blue and red bands) that lie immediately adjacent to the solar cell spectral response region. As discussed below, the multilayer may comprise two, three, or more, thin-film materials. Also, the ultraviolet and infrared reflection bands may be spectrally located independently of each other, i.e. without regard for the position of the other reflection band. Unlike previous designs, such as the above-discussed Thelen designs, our infrared reflector includes order suppression means such that no short/low orders are present that would degrade optical transmission through the reflector and any associated cover. The order suppression means used in our infrared reflector results in the spectral locations of the two reflection bands in our new cover not being interconnected and not requiring thin film materials with prescribed values of refractive index.

FIGS. 13–16 depict exemplary embodiments of reflector covers which advantageously incorporate our order suppression, independent ultraviolet and infrared reflector design.

Figure 13:
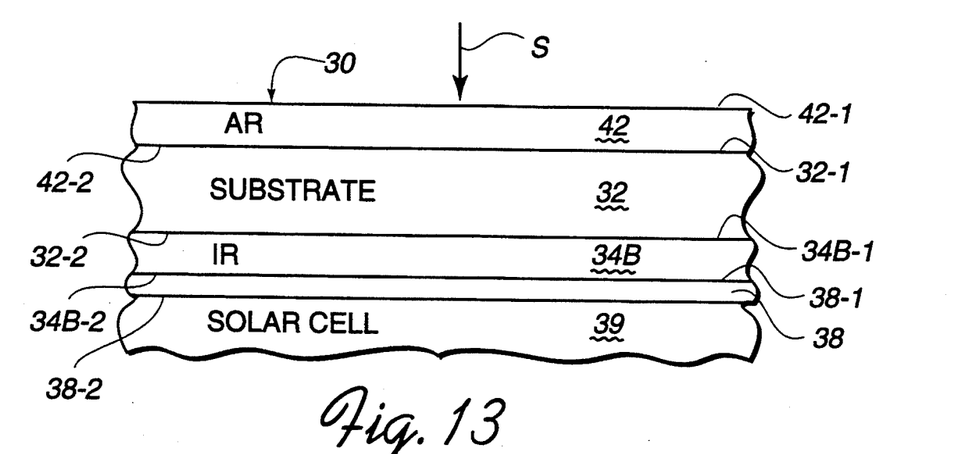
FIG. 13 is a cross-section, in schematic form, of a solar cell cover comprising an infrared reflector in accordance with our invention.

FIG. 13 depicts a solar cell 30 in accordance with our invention which comprises a substrate (SS) 32, an anti-reflection coating 42 formed on the solar-incident side 32-1 of the substrate, and a multilayer IR coating 34B which is formed on the back or opposite side 32-2 of the substrate. The IR reflector coating reflects IR bands lying immediately adjacent and above the solar cell spectral response region. The IR reflector coating preferably incorporates order suppression means in accordance with our invention. The AR/SS/IR cover 30 includes or has adhered to its back side a cement coating 38 which mechanically and optically joins the cover to the associated solar cell 39.

Figure 14:
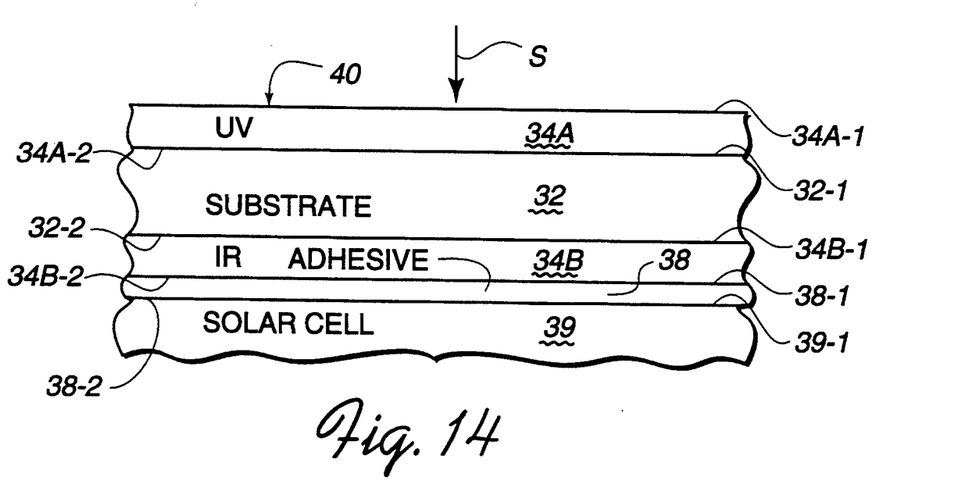
FIGS. 14–16 are schematicized cross-sections of solar cell covers comprising UV and IR reflectors in accordance with our invention.

Referring to FIG. 14, the illustrated multilayer solar cell cover 40 comprises a substrate 32 and a multilayer coating 34 comprising a reflector coating 34A which reflects UV bands lying immediately adjacent and below the spectral response region of the associated solar cell 39, and IR reflector coating 34B. Again the cover 40 includes or has adhered to the back side of the substrate 32 a cement coating 38 which mechanically and optically joins the cover to the associated solar cell 39.

A number of materials can be used in the substrate, the reflectors and the AR coating. For example, suitable substrate materials include in addition to the preferred cerium-doped glass and fused silica, other materials such as aluminum oxide or magnesium fluoride which are substantially transparent over the cell response range and are stable.

For convenience, we designate the major surfaces of the various layers/components "1" and "2", with 1 indicating the first or front side of the component, that on which solar radiation, S, is incident and 2 indicating the second or back side. The first or front sides 34A-1, 32-1, 34B-1 and 39-1, etc., are also called the "solar incident" sides of the UV coating, the substrate, the IR coating, and the solar cell, respectively, and the second or back sides 34A-2, 32-2, 34B-2, and 39-2 are also called the "opposite" sides.

In this and the other disclosed cover designs, the UV and IR components 34A and 34B typically are readily designed to reflect the UV and IR bands immediately adjacent 350 nm and 900 nm, for application to GaAs solar cells, and the bands immediately adjacent 350 and 1100 nm, in the case of silicon solar cells.

Figure 15:
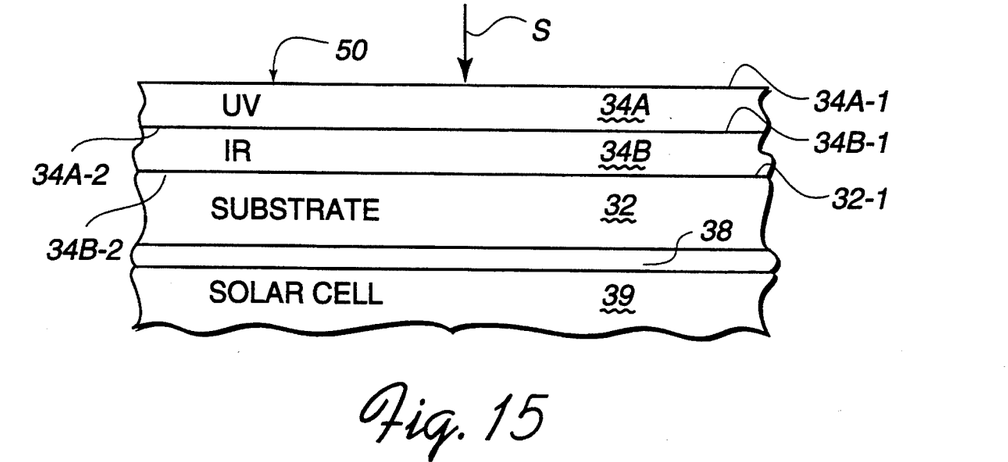

FIG. 15 depicts a solar cell cover embodiment 50 in which the UV and IR coatings 34A and 34B are a continuous coating 34. The UV coating 34A is formed on the solar incidence side 34B-1 of the IR coating 34B, and the IR coating is between the UV coating and the solar-incident surface 32-1 of the substrate.

Figure 16:
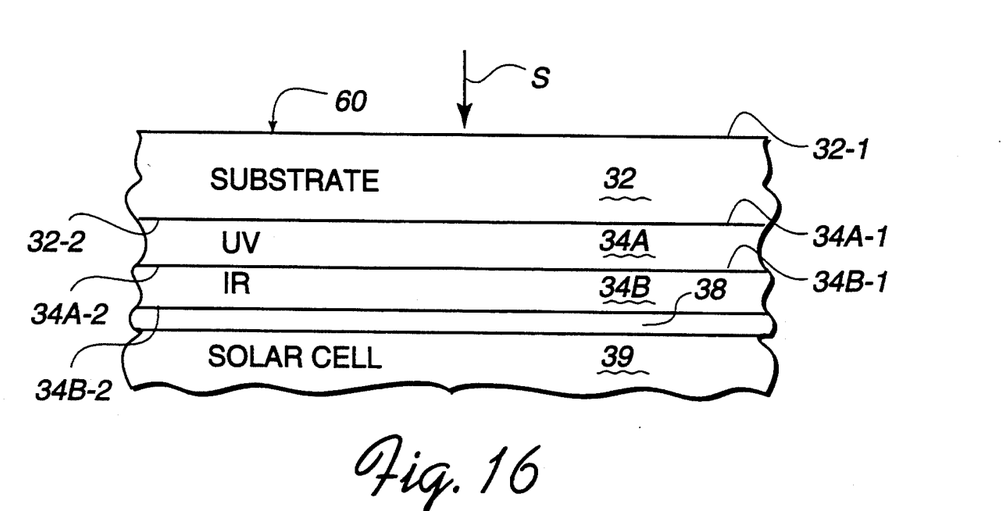

In the FIG. 16 embodiment 60, the UV and IR coatings 34A and 34B are again combined into a continuous coating 34, in this case one on the back surface 32-2 of the substrate 32. The UV coating 34A is between the substrate 32 and the IR coating 34B.

There are several other arrangements of substrate, UV and IR coatings, in addition to the four arrangements described above (AR/IR, UV/SS/IR, UV/IR/SS and SS/UV/IR). However, for the reasons discussed below, the above designs typically are preferred.

SPECIFIC DESIGN CONSIDERATIONS

Typically, the multilayer 34 is composed of 20–50 layers of low index of refraction (L) and high index of refraction (H) materials such as silicon dioxide ($SiO_2$) and tantalum pentoxide (tantala, $Ta_2O_5$) respectively. These space-qualified materials are transparent throughout the ultraviolet, visible, and infrared portions of the solar radiation spectrum. However, numerous other materials have the necessary optical properties. Other suitable high-index materials include, but are not limited to, cerium oxide ($CeO_2$), titania ($TiO_2$), zirconia ($ZrO_2$), niobia ($Nb_2O_5$), and hafnia ($HfO_2$). Suitable low-index materials include, but are not limited to, aluminum oxide ($Al_2O_3$) and magnesium fluoride ($MgF_2$).

As described below, the two thin film materials which are responsible for the ultraviolet reflection may be different from the two thin film materials which are responsible for the infrared reflection. Thus, although the simplest form of the new cover comprises two thin film materials, three or four thin film materials may be used.

As illustrated above in FIGS. 13–15, the multilayer coating 34 may be on one surface of the cover glass or may be divided between both surfaces. In either form, each portion of the multilayer transmits the wavelengths of solar radiation for which the cell is responsive. If it is on one surface or divided between the two surfaces, one portion of the multilayer is primarily responsible for reflecting the ultraviolet wavelengths and another portion is responsible for reflecting the infrared wavelengths.

As described above, the preferred three elements of the new cover—the substrate 32, the UV reflector 34A, and the IR reflector 34B—may be arranged in several ways. The incident solar radiation flows through the elements of the cover in a different order or sequence in each arrangement. Of the possible arrangements, only a few are preferred in providing the required function. In selecting an arrangement, one considers the spectral range of transparency and the contribution of each element to overall reflectance, solar transmission, and emissivity of the cover.

Two important factors to be considered in selecting the preferred design for the most common space applications include:

(1) Cerium-doped glass, which absorbs radiation with wavelengths shorter than about 350 nm, has higher emissivity than fused silica which transmits ultraviolet.

(2) First surface coatings, especially multilayer coatings composed of oxides, tend to modify and generally lower the emissivity of the surface of substrate onto which they are placed. This effect is larger for thicker coatings such as the infrared reflecting portion than for the thinner ultraviolet reflecting portion of the multilayer.

The general rule for heat reduction is that the ultraviolet reflecting component 34A of the multilayer coating 34 be on the side of solar incidence with respect to any ultraviolet-absorbing component. For example, if the substrate 32 is cerium-doped glass, the ultraviolet reflecting coating 34A is located on the solar-incident surface 32-1 of the substrate, to face the incoming solar radiation. In this example, emissivity considerations lead to placing the infrared reflector 34B behind the ultraviolet reflector 34A, i.e. either between the IR reflector and the substrate, or, preferably, on the second surface 32-1 of the substrate.

Although our preferred coating design for the divided or the undivided case contains two materials, there may be some benefit to three material designs in which the high index material in the infrared-reflecting portion of the designs is an ultraviolet-absorbing material such as titanium oxide. In the infrared wavelength region, titanium oxide has a higher refractive index than tantalum oxide. An infrared-reflecting stack made with titanium oxide would have a slightly wider reflection band compared to a stack containing tantalum oxide with an equal number of layers. It would also help to block the UV from penetrating through a UV-transparent substrate into a UV-sensitive cement. If an ultraviolet-absorbing material is used in the infrared-reflecting portion 34B of the solar cell cover coating, the ultraviolet-reflecting portion 34A of the coating design should be on the side of solar incidence.

If the new solar cell cover is made with an ultraviolet transparent cover glass or substrate 32 such as fused silica or quartz, and if it is to be attached to a spacecraft with ultraviolet degradable cement 38, then the multilayer coating 34 should include at least one, preferably several, layers of ultraviolet absorbing material such as titanium oxide to protect the cement. These ultraviolet absorbing layers may be near the second surface 34A-2 of the ultraviolet-reflecting portion of the design (as described by Rancourt and Seddon in the '732 patent), or in the infrared-reflecting portion 34B of the design.

The design of an undivided, ultraviolet-reflecting and infrared-reflecting multilayer coating for the first surface 32-1 of the cover glass typically differs slightly from the design for the second surface 32-2. Each design would be tailored to insure maximum transmission of the cover for light with wavelengths which are converted by the cell. For the first surface design, the flow of light would be from air or vacuum through the coating 34 and into the cover glass 32. For the second surface design, the flow of light would be from the cover glass 32 through the coating 34 and into the cement 38 and the cell 39. The different refractive indices of the surrounding media in the two cases may suggest difference in the sequences and thickness of the layers that will be readily implemented by those of usual skill in the art.

EXAMPLES

Examples of the new cover with both divided and undivided coatings for use with silicon and GaAs solar cells are described. The multilayer coatings in these examples comprise silicon oxide and tantalum oxide. Spectral measurements of several of the examples are also provided.

Figure 2:
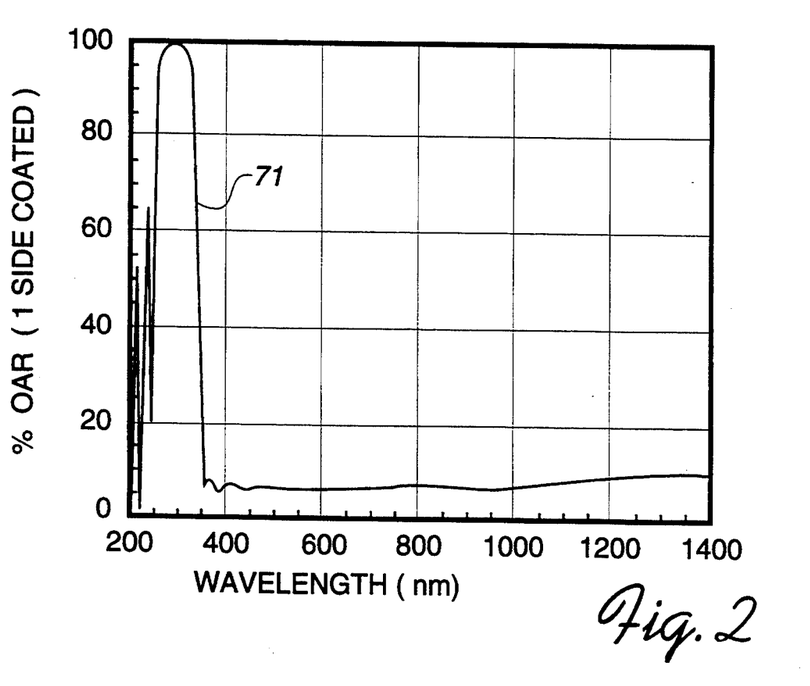
FIGS. 2–12 depict the spectral performance of certain designs according to our invention, including those of TABLES I-V.

TABLE I is a 16 layer design for the UVR coating for the first surface of a cerium-doped glass substrate. (The highest numbered layer in this and the other tables is adjacent the substrate.) The calculated reflectance of the coating is shown in FIG. 2. This design reflects a band of wavelengths shorter than about 350 nm and transmits longer wavelengths. This coating is composed of ultraviolet transparent thin film materials and does not, by itself, provide adequate ultraviolet shielding for most solar cell cements. If this coating is used for an ultraviolet-transparent substrate such as fused silica, layers of materials containing titanium oxide may be added to the UVR design or the infrared reflecting coating on the second surface of the substrate to shield the cement. The UVR design is essentially as described by Rancourt and Seddon in their commonly assigned U.S. Pat. No. 4,293,732.

The long-wavelength edge of the reflection band, shown here at 350 nm, is determined by the thicknesses of the layers in the design. The edge may be adjusted to longer or shorter wavelengths as needed. The ultraviolet reflecting coating may contain more or less layers of tile same or different ultraviolet transparent thin film materials than listed in the table. With the same thin film materials, a design with more or less layers may reflect a greater or lesser portion of the solar ultraviolet radiation with wavelengths below the cut-on wavelength of 350 nm. Similar designs that incorporate different ultraviolet transparent thin film materials may be used.

TABLE II is the design of a 37-layer short-wave pass (SWP) infrared-reflecting coating for silicon solar cells. The design is listed in order from the layer furthest from the substrate to the layer adjacent to the substrate. The refractive index of layer number 37, which is adjacent to the substrate, is similar to the substrate. That layer may be deleted without affecting the performance of the design. We have left this layer in the table to preserve the historical origins of the new cover. In our example coatings, low-index layers adjacent to the substrate were omitted.

Figure 3A:
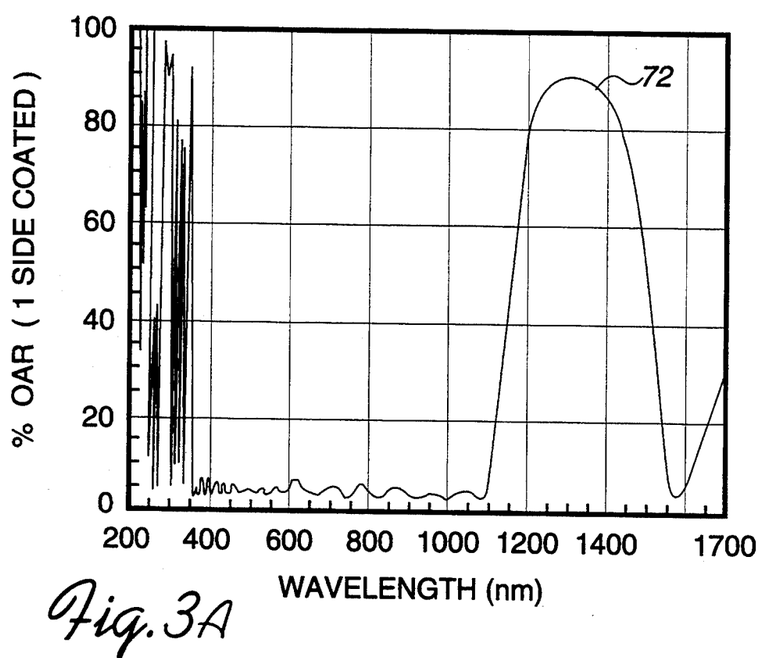
Figure 3B:
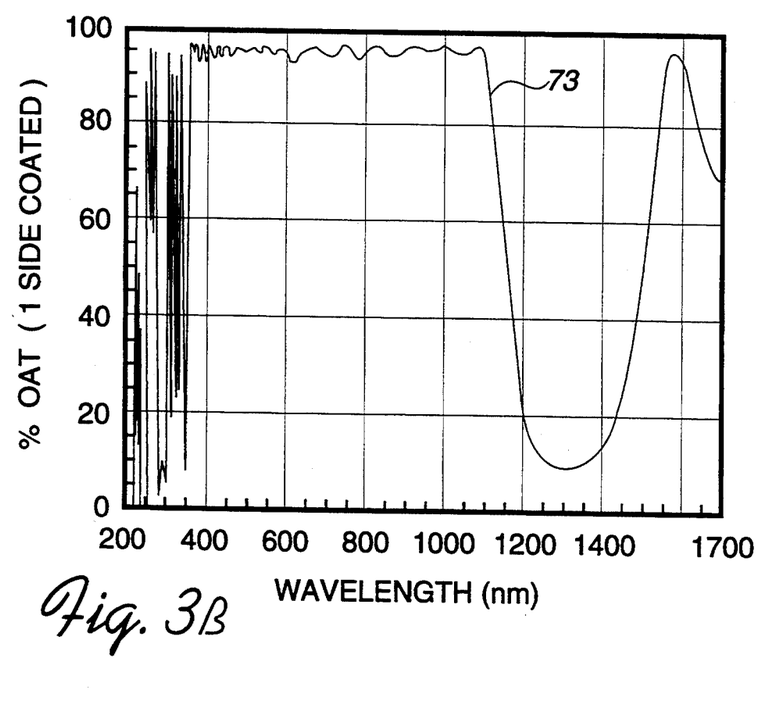

FIGS. 3A and 3B shows the calculated spectral performance for light incident normally on this design on a nonabsorbing fused silica substrate. The design reflects a band of infrared wavelengths between 1100 and 1600 nm and transmits nearly perfectly the shorter wavelengths extending to 350 nm for which the silicon cell is responsive. The calculation is for a substrate coated on one side with no coating on the second side.

Figure 4A:
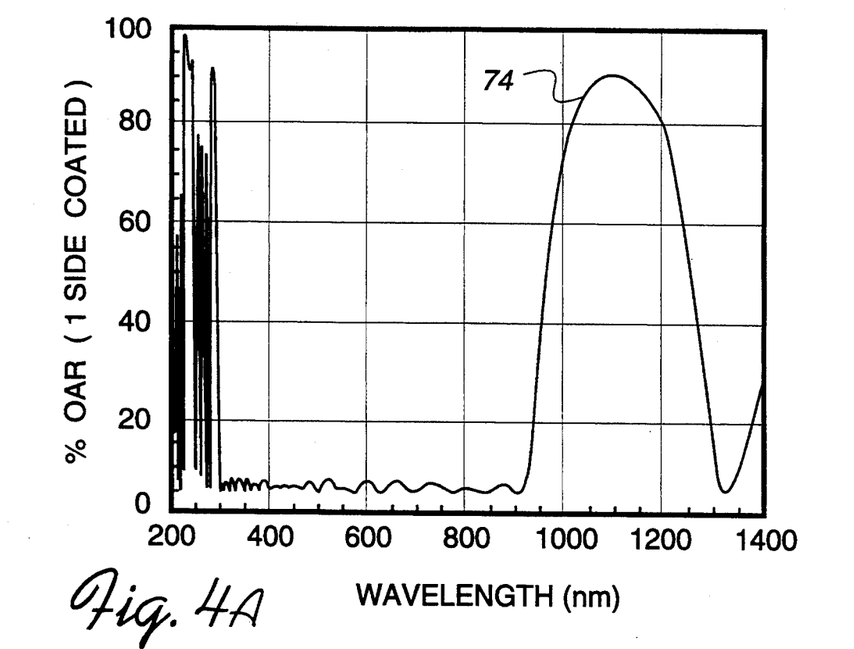
Figure 4B:
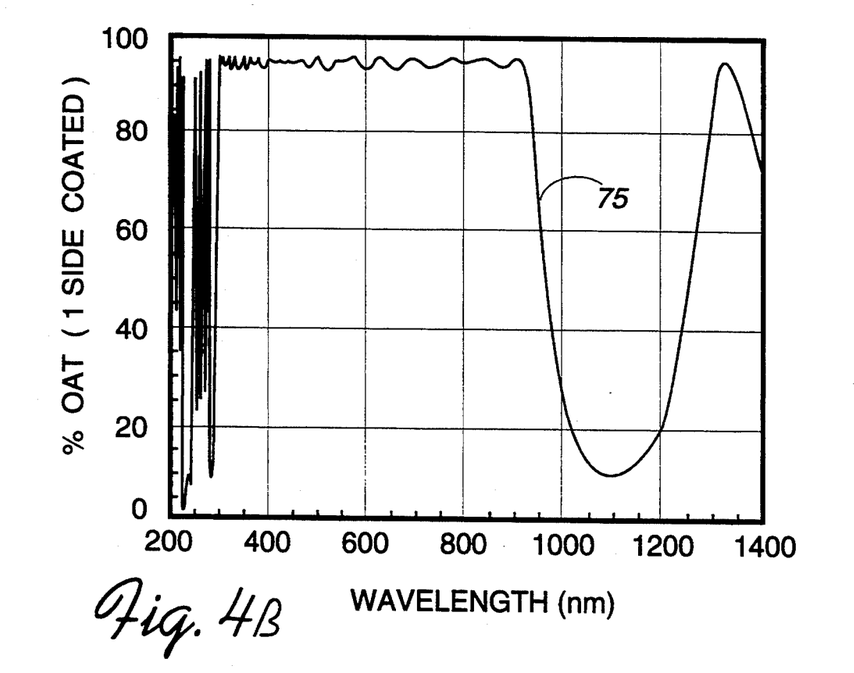

FIGS. 4A and 4B are similar to FIG. 3 except the infrared reflection band is located at shorter wavelengths. The design reflects a band of infrared wavelengths between 900 and 1300 nm and transmits nearly perfectly the shorter wavelengths extending to 300 nm. As indicated in the caption, this design is tailored for the spectral response of the GaAs solar cell. The design is listed in TABLE III.

The refractive indices of the same thin film materials in TABLES II and III are slightly different. The values provided in the tables are representative of the different thin film deposition processes for which the two designs were prepared. The real differences between the designs in these tables are in the thicknesses of the layers and not the subtle differences in the indices of the materials.

Figure 5:
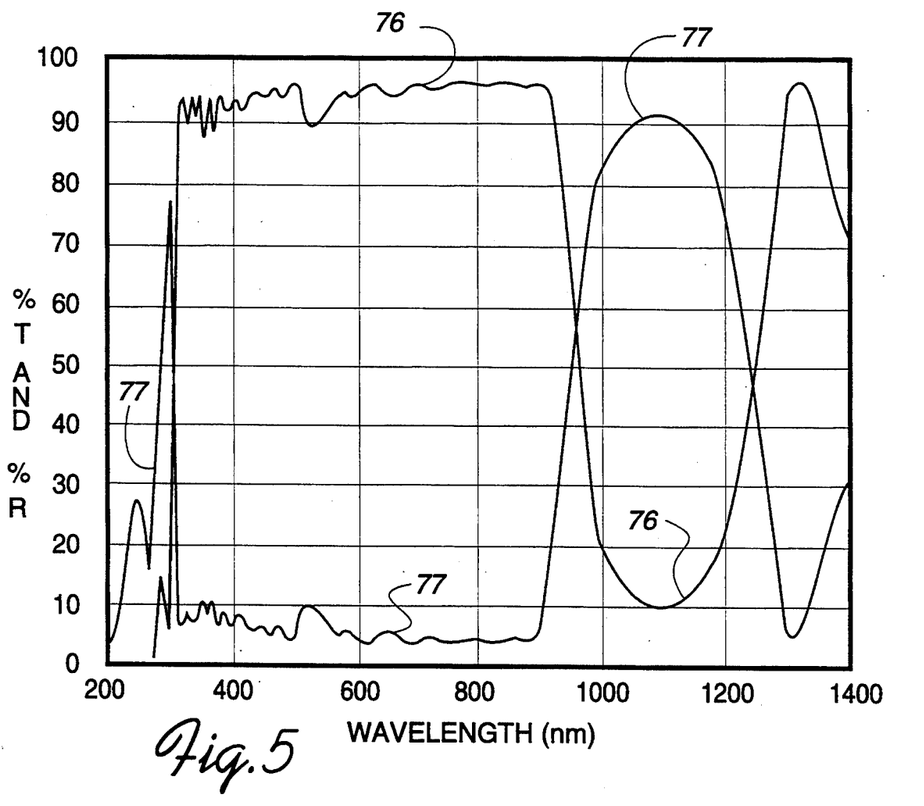

FIG. 5 is the measured spectral performance of the GaAs-SWP design on a fused silica substrate; the reflectance and transmittance curves are superposed on the same graph. The measured curves are similar to the calculations shown in FIG. 4 except in the wavelength region below about 300 nm where the high-index material, tantalum oxide, is partially absorbing. This coating is on a fused silica substrate in order to demonstrate the agreement between the calculated and measured results.

The infrared-reflecting SWP coating designs in TABLES II and III are unique in part in that they include means for order suppression in accordance with our invention. The designs include a series of thick layers, identified in the tables by the suffix "T" and by shaded thickness values, which are separated by thin layers. The thin layers match the thick layer materials in the wavelength region of high transmission. The term "match" refers to admittance matching or impedance matching and effectively eliminates reflection between the materials. Evidence for the matching function is provided in FIG. 6.

Figure 6:
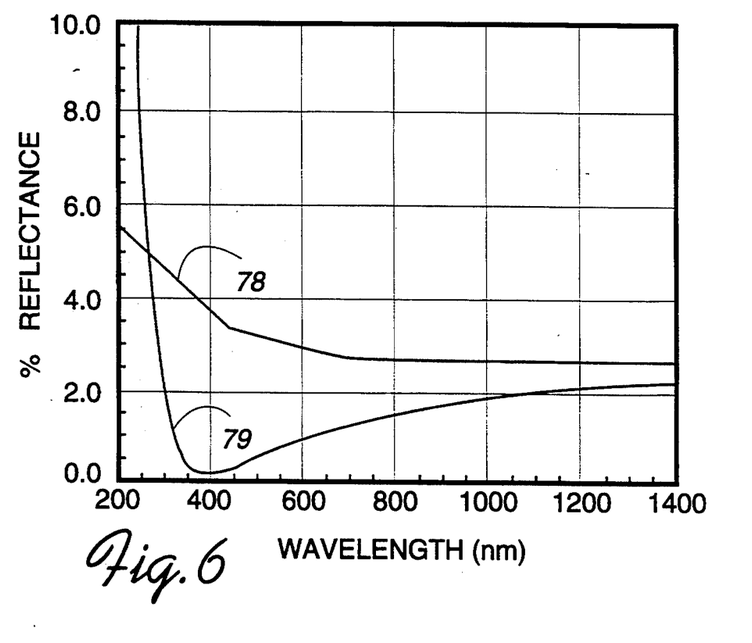

The upper curve in FIG. 6 is the calculated spectral reflection between semi-infinite media composed of silicon dioxide (SiO2) and tantalum pentoxide (Ta2O5) media. The refractive indices of the two materials for several wavelengths are listed in TABLE IV. For intermediate wavelengths, the indices are interpolated from values in the table. A more sophisticated interpolation will yield a smooth curve rather than the segmented shape of the upper curve. The lower curve in FIG. 6 is the calculated spectral reflection between the two media separated by a pair of thin layers. The thin layers are the same as layers 8 and 9 in TABLE III; also the same as most of the other two-layer pairs in this design. Note that the reflection is reduced in the region between 300 and 900 nm and especially between 350 and 600 nm, by the thin layers. The central wavelength of the infrared-reflecting band of the SWP design (TABLE III and FIG. 4) is about 1150 nm. In the absence of the thin matching layers, higher-order reflection bands would appear near the wavelengths of 575 nm and 382 nm. The effect of the matching layers is to eliminate these higher order bands. The number of high order bands eliminated depends upon the breadth of the wavelength region over which the principal (thick) layers are matched.

The infrared reflecting SWP coating may contain more or fewer layers of the same or different thin film materials than are listed in TABLES II or III. With the same thin film materials, a design with more or fewer layers may reflect a greater or lesser portion of the solar infrared radiation with wavelengths greater than the long wavelength limit of the solar cell spectral response. Similar designs that incorporate different film materials may be used. Please note, in the various design techniques, the suppression of orders allows the independence or decoupling of the UV reflectance and IR reflectance bands.

Figure 7A:
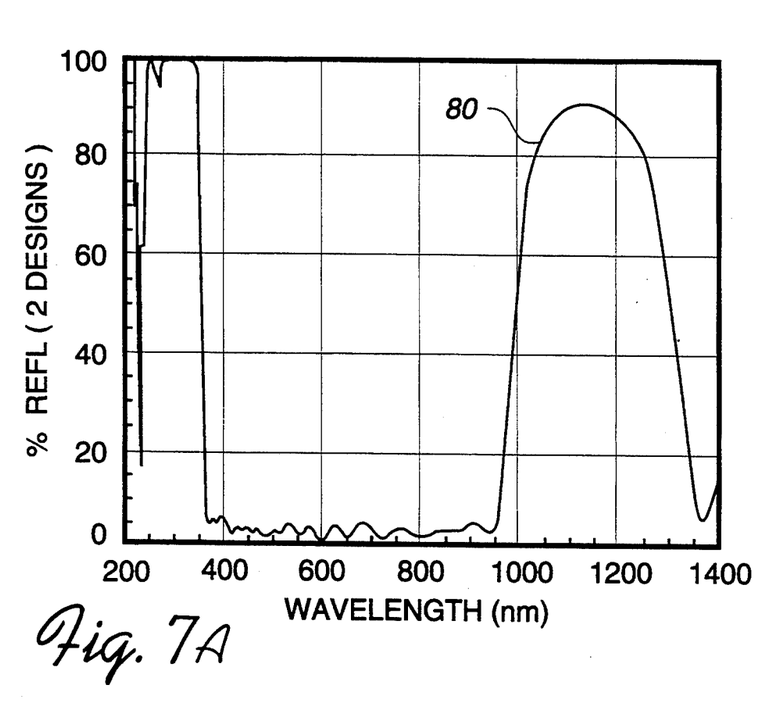
Figure 7B:
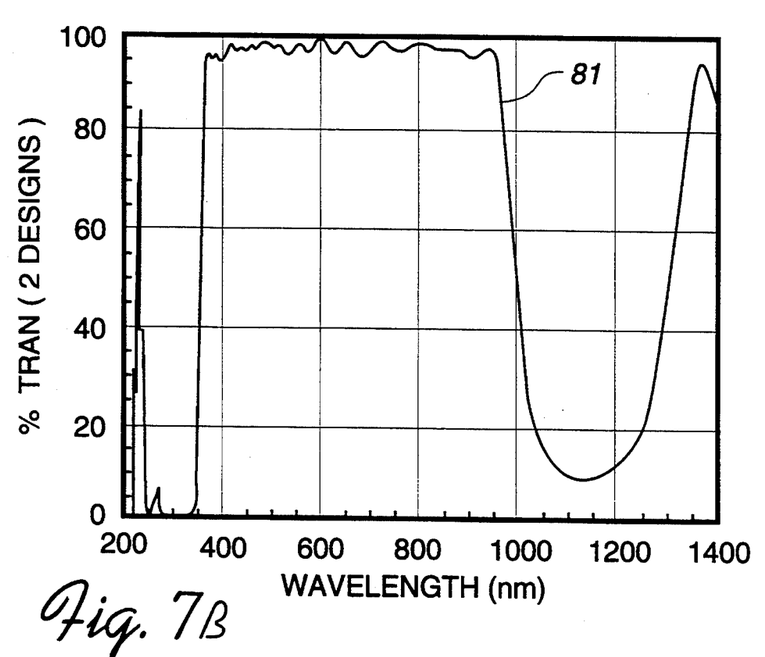
Figure 8:
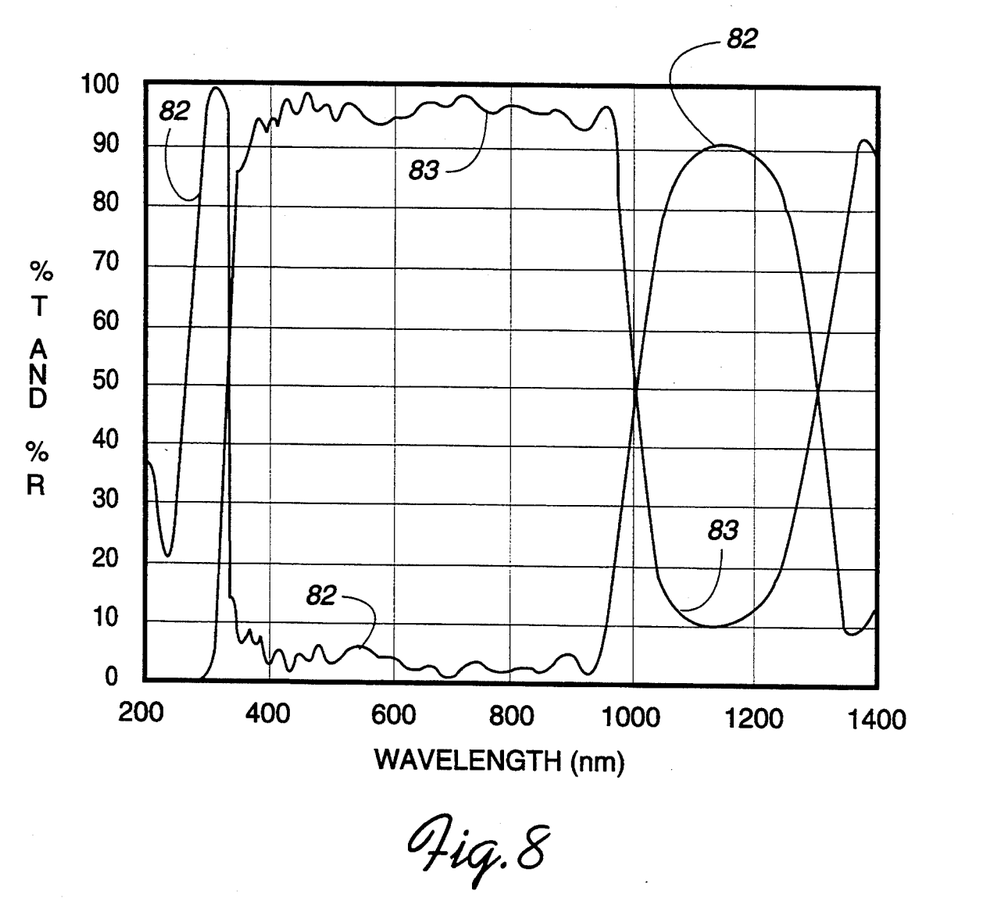

FIGS. 7A–7B and 8 respectively are the calculated and measured performance of the ultraviolet-reflecting, infrared-reflecting coating for GaAs. This is a divided coating in which the UV-reflecting coating and the IR-reflecting coating are on opposite sides of the substrate. The single UV and IR-reflecting coating is discussed below. The curves verify that the solar cell cover transmits the useful wavelength region between 350 and 900 nm and reflects adjacent ultraviolet and infrared bands. The designs for the calculation (FIGS. 7A–7B) and the experiment (FIG. 8) are in TABLES I and III. As mentioned above, these coatings and the fused silica substrate transmit ultraviolet radiation which may degrade a solar cell cover cement. If used with an ultraviolet sensitive cement, one of the coatings or the substrate should absorb ultraviolet radiation with wavelengths shorter than about 350 nm.

Figure 9A:
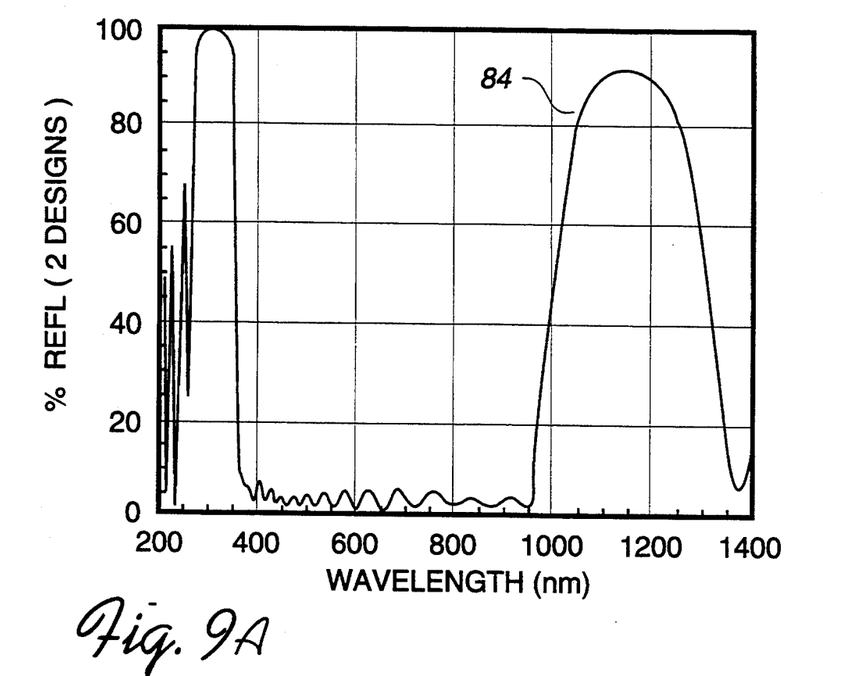
Figure 9B:
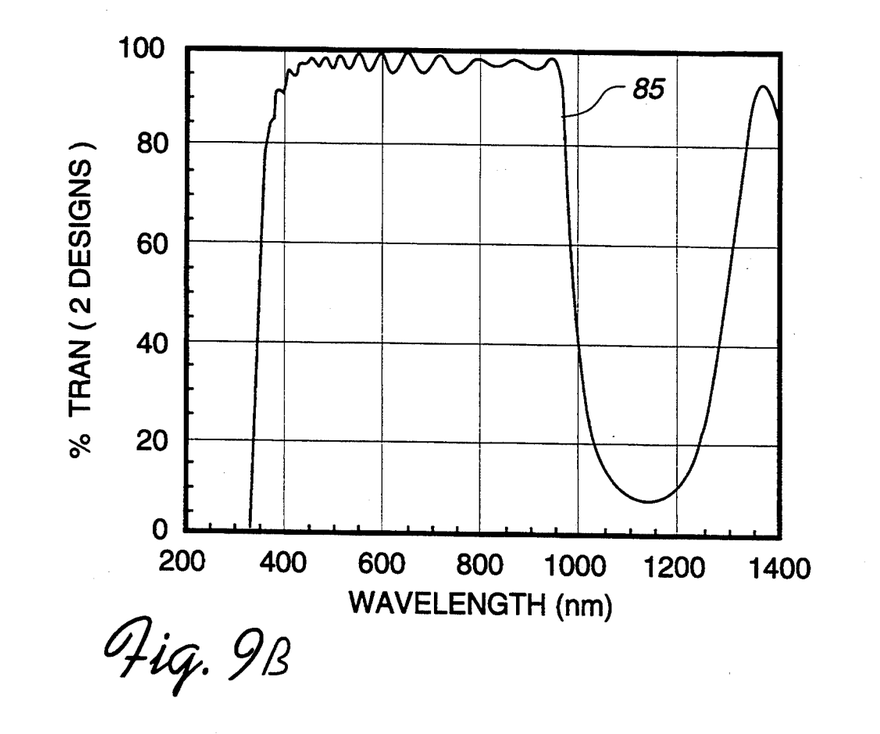
Figure 10:
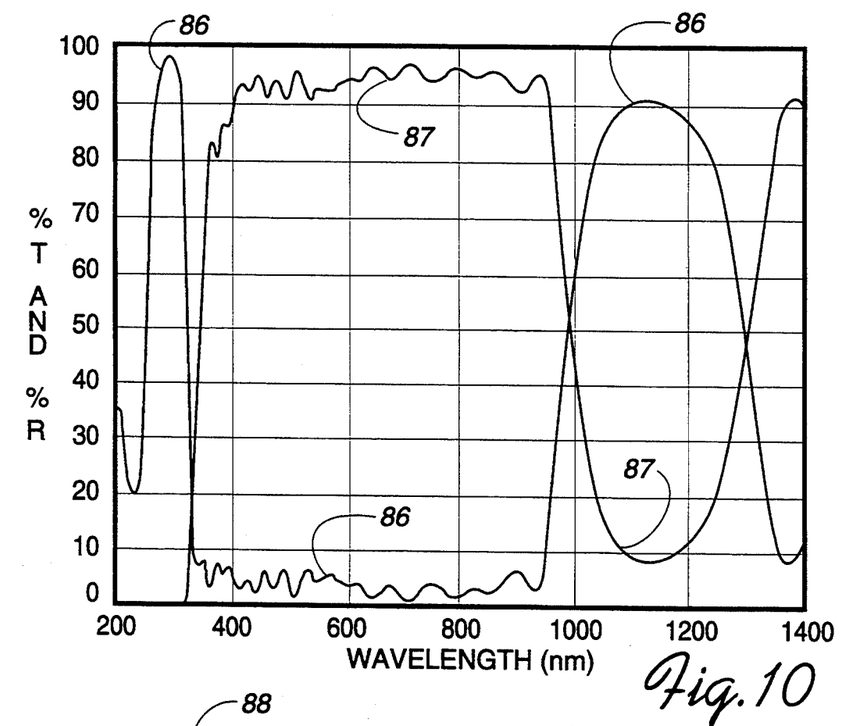
Figure 11:
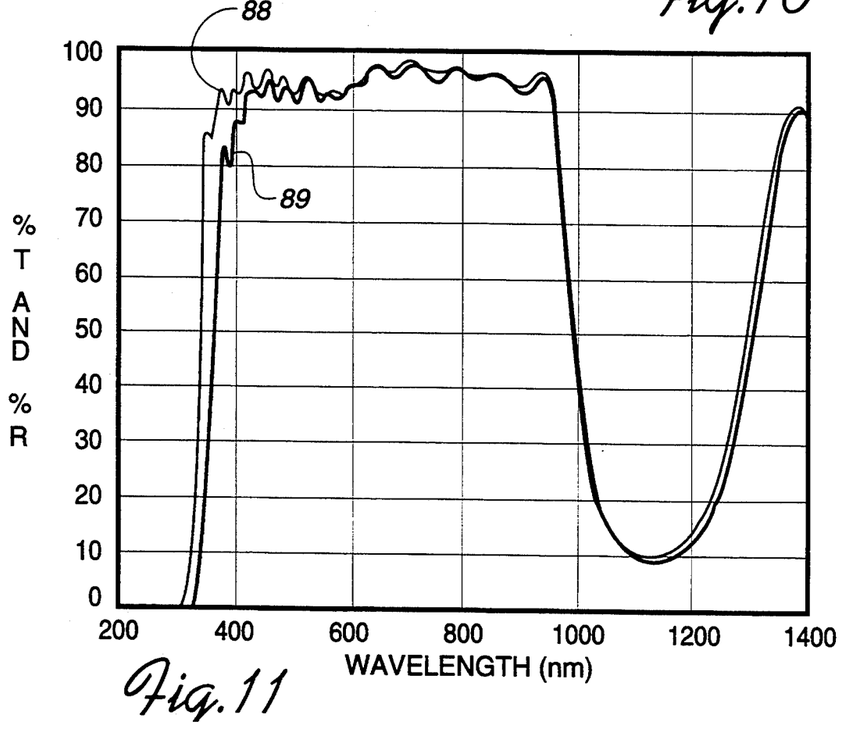
Figure 12A:
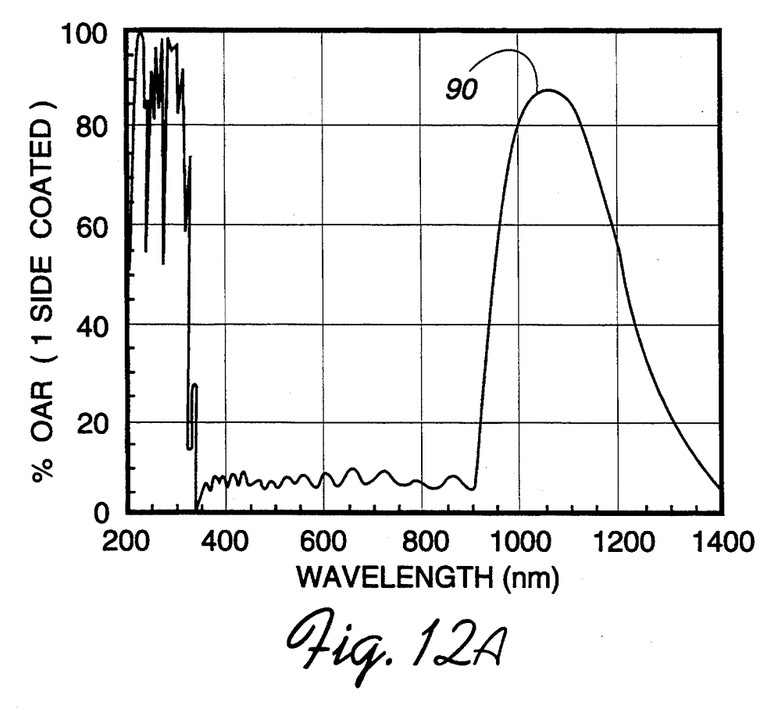
Figure 12B:
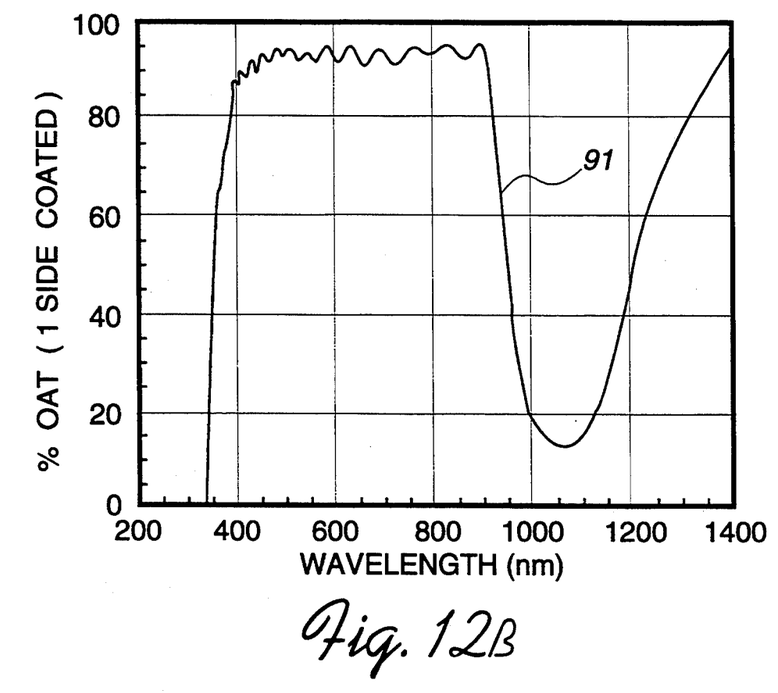

FIGS. 9A–9B and 10 are the calculated and measured performance of the same designs applied to cerium-doped glass. These figures are nearly identical to the previous two figures because the transmission of the substrates differs only in the ultraviolet region. FIG. 11 compares the two measured transmission curves.

TABLE V is a 43-layer design for a combination UV-and IR-reflecting coating for the first surface of an ultraviolet absorbing glass substrate for use with GaAs solar cells. The layers are listed in order from the side of incidence. The first portion of the design, including layers 2–9, is primarily responsible for reflecting a band of ultraviolet wavelengths shorter than about 350 nm. The second portion of the design, especially layers 13–40, is primarily responsible for reflecting a band of infrared wavelengths longer than about 900 nm. Means for layer matching order suppression is provided. The thicker layers in this portion of the design are identified with shading and the suffix "T," as in TABLES II and III Other layers which surround the two indicated portions of the design serve to minimize undesired reflection of light with wavelengths that lie between the two reflection bands.

The UV and IR reflecting multilayer coating for the new solar cell cover, whether the UV and IR reflectors are separated or combined, has the following distinguishing features:

(1) The IR reflecting coating, or portion of the combined coating reflects a band of radiation that is spectrally adjacent to the long wavelength limit of the solar cell response region and transmits the shorter wavelength radiation for which the cell is responsive.

(2) The UV reflecting coating, or portion of the combined coating, reflects a band of radiation that is spectrally adjacent to the short wavelength limit of the solar cell response region and transmits the longer wavelength radiation for which the cell is responsive. As indicated in one example for GaAs cells, it may be beneficial to the overall function of the solar cell cover for the ultraviolet reflection band to be placed at a slightly longer wavelength where it encroaches on the solar cell response region.

(3) The separate spectral locations of the UV and IR reflecting bands are dictated by the requirements of the solar cell and are not constrained by the thin film materials or the thin film coating design. If the UV and IR reflecting function are combined in a single thin film design, e.g., as in TABLE V, adjustments of the thicknesses of some layers may be required to insure maximum transmission throughout the region between the reflecting bands.

(4) The UV and IR reflecting coatings, or portions of the coating, and the substrate are arranged relative to each other and to the direction of solar radiation to provide (a) low absorption for solar radiation with wavelengths outside the region of solar cell response and (b) high emissivity. Typically, the UV reflecting coating, or portion of the coating, is in the position to first receive the incident solar radiation. For a cerium-doped substrate, the emissivity is highest if the IR reflecting coating is placed on the second surface of the cover. For a fused silica substrate, the emissivity may be highest if the UV and IR reflecting portion of the coating are combined onto the first surface.

These example thin film designs are not exhaustive. Designs with different or improved performance may be found by applying the usual methods of thin film design including computer refinement or optimization. The number of layers and the thicknesses of the layers provided by these methods may differ from these example designs. However, the major components of the designs will be as described above.

The present invention has been described in terms of preferred and other embodiments. The invention however is not limited to the embodiments described and depicted. Rather, the scope of the invention is defined by the appended claims. Based upon the above disclosure of preferred and alternative embodiments of the invention, those of usual skill in the art will readily derive alternatives and implement modifications which are within the scope of the Claims of this patent document.

TABLE I

| layer number | material name | refractive index for 550 nm | thickness in nanometers physical | QWOT |
|---|---|---|---|---|
| 1 | SiO2 | 1.458 | 124.87 | 728.0 |
| 2 | Ta2O5 | 2.123 | 24.26 | 206.0 |
| 3 | SiO2 | 1.458 | 49.05 | 286.0 |
| 4 | Ta2O5 | 2.123 | 33.44 | 284.0 |
| 5 | SiO2 | 1.458 | 48.71 | 284.0 |
| 6 | Ta2O5 | 2.123 | 33.44 | 284.0 |
| 7 | SiO2 | 1.458 | 48.71 | 284.0 |
| 8 | Ta2O5 | 2.123 | 33.44 | 284.0 |
| 9 | SiO2 | 1.458 | 48.71 | 284.0 |
| 10 | Ta2O5 | 2.123 | 33.44 | 284.0 |
| 11 | SiO2 | 1.458 | 47.00 | 274.0 |
| 12 | Ta2O5 | 2.123 | 30.03 | 255.0 |
| 13 | SiO2 | 1.458 | 54.03 | 315.0 |
| 14 | Ta2O5 | 2.123 | 20.61 | 175.0 |
| 15 | SiO2 | 1.458 | 59.35 | 346.0 |
| 16 | Ta2O5 | 2.123 | 7.77 | 66.0 |

TABLE IV

| Wavelength nm | SiO2 | Ta2O5 |
|---|---|---|
| 200 | 1.470 | 2.380 |
| 500 | 1.459 | 2.109 |
| 800 | 1.450 | 2.026 |
| 1100 | 1.450 | 2.020 |
| 1400 | 1.450 | 2.020 |

TABLE II

| layer number | material name | refractive index for 340 mn | thickness in nanometers physical | QWOT |
|---|---|---|---|---|
| 1 | SiO2 | 1.477 | 100.56 | 594.1 |
| 2 | Ta2O5 | 2.330 | 27.88 | 259.9 |
| 3 | SiO2 | 1.477 | 13.83 | 81.7 |
| 4 | Ta2O5 | 2.330 | 83.25 | 775.9 |
| 5 | SiO2 | 1.477 | 24.57 | 145.2 |
| 6 | Ta2O5 | 2.330 | 21.86 | 203.7 |
| 7T | SiO2 | 1.477 | 200.91 | 1187.1 |
| 8 | Ta2O5 | 2.330 | 19.90 | 185.4 |
| 9 | SiO2 | 1.477 | 22.56 | 133.3 |
| 10T | Ta2O5 | 2.830 | 101.97 | 950.4 |
| 11 | SiO2 | 1.477 | 22.56 | 133.3 |
| 12 | Ta2O5 | 2.330 | 19.90 | 185.4 |
| 13T | SiO2 | 1.477 | 196.16 | 1159.0 |
| 14 | Ta2O5 | 2.330 | 19.90 | 185.4 |
| 15 | SiO2 | 1.477 | 22.56 | 133.3 |
| 16T | Ta2O5 | 2.330 | 101.97 | 950.4 |
| 17 | SiO2 | 1.477 | 22.56 | 133.3 |
| 18 | Ta2O5 | 2.330 | 19.90 | 185.4 |
| 19T | SiO2 | 1.477 | 196.16 | 1159.0 |
| 20 | Ta2O5 | 2.330 | 19.90 | 185.4 |
| 21 | SiO2 | 1.477 | 22.56 | 133.3 |
| 22T | Ta2O5 | 2.330 | 101.97 | 1159.0 |
| 23 | SiO2 | 1.477 | 22.56 | 133.3 |
| 24 | Ta2O5 | 2.330 | 19.90 | 185.4 |
| 25T | SiO2 | 1.477 | 196.16 | 1159.0 |
| 26 | Ta2O5 | 2.330 | 19.90 | 185.4 |
| 27 | SiO2 | 1.477 | 22.56 | 133.3 |
| 28T | Ta2O5 | 2.330 | 101.97 | 950.4 |
| 29 | SiO2 | 1.477 | 22.56 | 133.3 |
| 30 | Ta2O5 | 2.330 | 19.90 | 185.4 |
| 31T | SiO2 | 1.477 | 200.91 | 1187.1 |
| 32 | Ta2O5 | 2.330 | 21.34 | 198.9 |
| 33 | SiO2 | 1.477 | 26.02 | 153.7 |
| 34T | Ta2O5 | 2.330 | 136.27 | 1270.0 |
| 35 | SiO2 | 1.477 | 30.77 | 181.8 |
| 36 | Ta2O5 | 2.330 | 17.41 | 162.3 |
| 37 | SiO2 | 1.477 | 106.34 | 628.3 |

TABLE III

| layer number | material name | refractive index for 340 mn | thickness in nanometers physical | QWOT |
|---|---|---|---|---|
| 1 | SiO2 | 1.470 | 82.82 | 487.0 |
| 2 | Ta2O5 | 2.239 | 23.78 | 213.0 |
| 3 | SiO2 | 1.470 | 11.39 | 67.0 |
| 4 | Ta2O5 | 2.239 | 71.00 | 636.0 |
| 5 | SiO2 | 1.470 | 20.24 | 119.0 |
| 6 | Ta2O5 | 2.239 | 18.64 | 167.0 |
| 7T | SiO2 | 1.470 | 165.48 | 973.0 |
| 8 | Ta2O5 | 2.239 | 16.97 | 152.0 |
| 9 | SiO2 | 1.470 | 18.58 | 109.3 |
| 10T | Ta2O5 | 2.239 | 86.96 | 779.0 |
| 11 | SiO2 | 1.470 | 18.58 | 109.2 |
| 12 | Ta2O5 | 2.239 | 16.97 | 152.0 |
| 13T | SiO2 | 1.470 | 161.56 | 950.0 |
| 14 | Ta2O5 | 2.239 | 16.97 | 152.0 |
| 15 | SiO2 | 1.470 | 18.58 | 109.3 |
| 16T | Ta2O5 | 2.239 | 86.96 | 779.0 |
| 17 | SiO2 | 1.470 | 18.58 | 109.2 |
| 18 | Ta2O5 | 2.239 | 16.97 | 152.0 |
| 19T | SiO2 | 1.470 | 161.56 | 950.0 |
| 20 | Ta2O5 | 2.239 | 16.97 | 152.0 |
| 21 | SiO2 | 1.470 | 18.58 | 109.3 |
| 22T | Ta2O5 | 2.239 | 86.96 | 779.0 |
| 23 | SiO2 | 1.470 | 18.58 | 109.2 |

TABLE III-continued

| layer number | material name | refractive index for 340 nm | thickness in nanometers physical | QWOT |
|---|---|---|---|---|
| 24 | Ta2O5 | 2.239 | 16.97 | 152.0 |
| 25T | SiO2 | 1.470 | 161.56 | 950.0 |
| 26 | Ta2O5 | 2.239 | 16.97 | 152.0 |
| 27 | SiO2 | 1.470 | 18.58 | 109.3 |
| 28T | Ta2O5 | 2.239 | 86.95 | 779.0 |
| 29 | SiO2 | 1.470 | 18.58 | 109.2 |
| 30 | Ta2O5 | 2.239 | 16.97 | 152.0 |
| 31T | SiO2 | 1.470 | 165.48 | 973.0 |
| 32 | Ta2O5 | 2.239 | 18.20 | 16.0 |
| 33 | SiO2 | 1.470 | 21.43 | 126.0 |
| 34T | Ta2O5 | 2.239 | 116.21 | 1041.0 |
| 35 | SiO2 | 1.470 | 25.34 | 149.0 |
| 36 | Ta2O5 | 2.239 | 14.85 | 133.0 |
| 37 | SiO2 | 1.470 | 87.59 | 515.0 |

TABLE V

| layer number | material name | refractive index for 340 mn | thickness in nanometers physical | QWOT |
|---|---|---|---|---|
| 1 | SiO2 | 1.470 | 109.01 | 641.0 |
| 2 | Ta2O5 | 2.239 | 27.57 | 247.0 |
| 3 | SiO2 | 1.470 | 43.03 | 253.0 |
| 4 | Ta2O5 | 2.239 | 31.70 | 284.0 |
| 5 | SiO2 | 1.470 | 48.30 | 284.0 |
| 6 | Ta2O5 | 2.239 | 31.70 | 284.0 |
| 7 | SiO2 | 1.470 | 48.30 | 284.0 |
| 8 | Ta2O5 | 2.239 | 31.70 | 284.0 |
| 9 | SiO2 | 1.470 | 34.18 | 201.0 |
| 10 | Ta2O5 | 2-239 | 16.41 | 147.0 |
| 11 | SiO2 | 1.470 | 20.58 | 121.0 |
| 12 | Ta2O5 | 2.239 | 11.16 | 100.0 |
| 13T | SiO2 | 1.470 | 185.88 | 1093.0 |
| 14 | Ta2O5 | 2.239 | 16.97 | 152.0 |
| 15 | SiO2 | 1.470 | 18.58 | 109.3 |
| 16T | Ta2O5 | 2.239 | 86.95 | 779.0 |
| 17 | SiO2 | 1.470 | 8.58 | 109.3 |
| 18 | Ta2O5 | 2.239 | 16.97 | 152.0 |
| 19T | SiO2 | 1.470 | 161.56 | 950.0 |
| 20 | Ta2O5 | 2.239 | 16.97 | 152.0 |
| 21 | SiO2 | 1.470 | 18.58 | 109.3 |
| 22T | Ta2O5 | 2.239 | 86.96 | 779.0 |
| 23 | SiO2 | 1.470 | 18.58 | 109.3 |
| 24 | Ta2O5 | 2.239 | 16.97 | 152.0 |
| 25T | SiO2 | 1.470 | 161.56 | 950.0 |
| 26 | Ta2O5 | 2.239 | 16.97 | 152.0 |
| 27 | SiO2 | 1,470 | 18.58 | 109.3 |
| 28T | Ta2O5 | 2.239 | 86.96 | 779.0 |
| 29 | SiO2 | 1.470 | 18.58 | 109.3 |
| 30 | Ta2O5 | 2.239 | 16.97 | 152.0 |
| 31T | SiO2 | 1.470 | 161.56 | 950.0 |
| 32 | Ta2O5 | 2.239 | 16.97 | 152.0 |
| 33 | SiO2 | 1.470 | 18.58 | 109.3 |
| 34T | Ta2O5 | 2.239 | 86.96 | 779.0 |
| 35 | SiO2 | 1.470 | 19.58 | 109.3 |
| 36 | Ta2O5 | 2.239 | 16.97 | 152.0 |
| 37T | SiO2 | 1.470 | 154.76 | 910.0 |
| 38 | Ta2O5 | 2.239 | 13.84 | 124.0 |
| 39 | SiO2 | 1.470 | 22.62 | 133.0 |
| 40T | Ta2O5 | 2.239 | 124.47 | 115.0 |
| 41 | SiO2 | 1.470 | 27.55 | 162.0 |
| 42 | Ta2O5 | 2.239 | 16.97 | 152.0 |
| 43 | SiO2 | 1.470 | 87.59 | 515.0 |

What is claimed is:

1. A red reflector cover for a solar cell or panel having a given spectral response range of solar radiation incident on the solar cell or panel, the cover comprising:

a substrate of material transparent over the spectral response range of the solar cell or panel; and a multilayer thin film composite formed on the substrate and comprising alternating layers of low and high index of refraction materials, the layers including an infrared reflector comprising (a) a first group of layers selected for reflecting incident infrared radiation immediately adjacent and above the longer wavelength end of the response range, (b) an anti-reflection component comprising one or more layers selected for decreasing the reflection of incident radiation across the spectral response range, and (c) means for suppressing low order reflection, whereby the reflection band of the infrared reflector is independent of the reflection band associated with any other group of layers.

2. The cover of claim 1, wherein the composite is positioned on the solar incident side of the substrate.

3. The cover of claim 2, wherein the substrate is UV-absorbing.

4. The cover of claim 2, wherein the substrate is ceria-doped glass.

5. A blue red reflector cover for a solar cell or panel having a given spectral response range to solar radiation incident on the cell or panel, the cover comprising:

a substrate of material transparent over the spectral response range of the solar cell or panel and having a first major surface adapted to face the solar incident side of the solar cell or panel and a second major surface on the side thereof optically opposite the solar incident side;

a multilayer thin film composite comprising alternating layers of low and high index of refraction materials, the composite including an ultraviolet reflector comprising a first group of layers selected for reflecting ultraviolet radiation immediately adjacent and below the shorter wavelength end of the response range, an anti-reflection component comprising one or more layers selected for decreasing the reflection of incident radiation across the spectral response range, an infrared reflector comprising a second group of layers selected for reflecting infrared radiation immediately adjacent and above the longer wavelength end of the spectral response range, and means or suppressing low order reflection, whereby the reflection bands of the infrared reflector and the ultraviolet reflector are independent.

6. The cover of claim 5, wherein the ultraviolet reflector is formed on the solar incident side with respect to the infrared reflector.

7. The cover of claim 5, wherein the anti-reflection component comprises a third group of layers.

8. The cover of claim 5, wherein the ultraviolet reflector is positioned on the solar incident side of the substrate.

9. The cover of claim 8, wherein the substrate is UV-absorbing.

10. The cover of claim 8, wherein the substrate is ceria-doped glass.

11. The cover of claim 5, wherein both the UV reflector and the IR reflector are formed on the solar incident side of the substrate.

12. The cover of claim 11, wherein the substrate is UV-absorbing.

13. The cover of claim 11, wherein the substrate is ceria-doped glass.

14. The cover of claim 5, wherein both the UV reflector and the IR reflector are formed on the second major surface of the substrate.

15. The cover of claim 14, wherein the substrate is fused silica.

16. A blue red reflector cover for a solar cell on panel having a given spectral response range to solar radiation incident on the solar cell or panel, the cover comprising:
- a substrate of material transparent over the spectral response range of the solar cell or panel and having a first major surface adapted to face the solar incident side of the solar cell or panel and a second major surface on the side thereof optically opposite the solar incident side;
- a multilayer thin film composite comprising alternating layers of low and high index of refraction materials;
- an ultraviolet reflector comprising a first group of layers of the composite selected for reflecting ultraviolet radiation immediately adjacent the shorter wavelength end of the solar response range, the ultraviolet reflector being formed on the first major surface;
- an anti-reflection component comprising one or more layers selected for decreasing the reflection of incident radiation across the spectral response range; and
- an infrared reflector comprising a second group of layers selected for reflecting infrared radiation immediately adjacent the longer wavelength end of the solar response range, the infrared reflector being formed on the second major surface, and including order suppression means for suppressing low order reflection, whereby the reflection bands of the ultraviolet reflector and the infrared reflector are independent.

17. The cover of any of claims 1, 5 or 16, wherein the low index material is silicon oxide and the high index material is tantalum oxide.

18. The cover of any of claims 5 or 16, wherein the ultraviolet and infrared reflectors are designed for a solar cell or panel having a spectral response range of approximately 350-900 nm.

19. The cover of claim 18, wherein the low index material is silicon oxide and the high index material is tantalum oxide.

20. The cover of any of claims 5 or 16, wherein the ultraviolet and infrared reflectors are designed for a solar cell or panel having a spectral response range of approximately 350-1100 nm.

21. The cover of claim 20, wherein the low index material is silicon oxide and the high index material is tantalum oxide.

22. In combination:
- a solar cell or panel comprising a solar radiation responsive member; and
- the cover of any of claims 1, 5 or 16.

23. The combination of claim 22, wherein the responsive member is gallium arsenide.

24. The combination of claim 22, wherein the responsive member is silicon.

25. The combination of claim 22, wherein the substrate is selected from cerium glass and fused silica.

* * * * *